Figure 1:
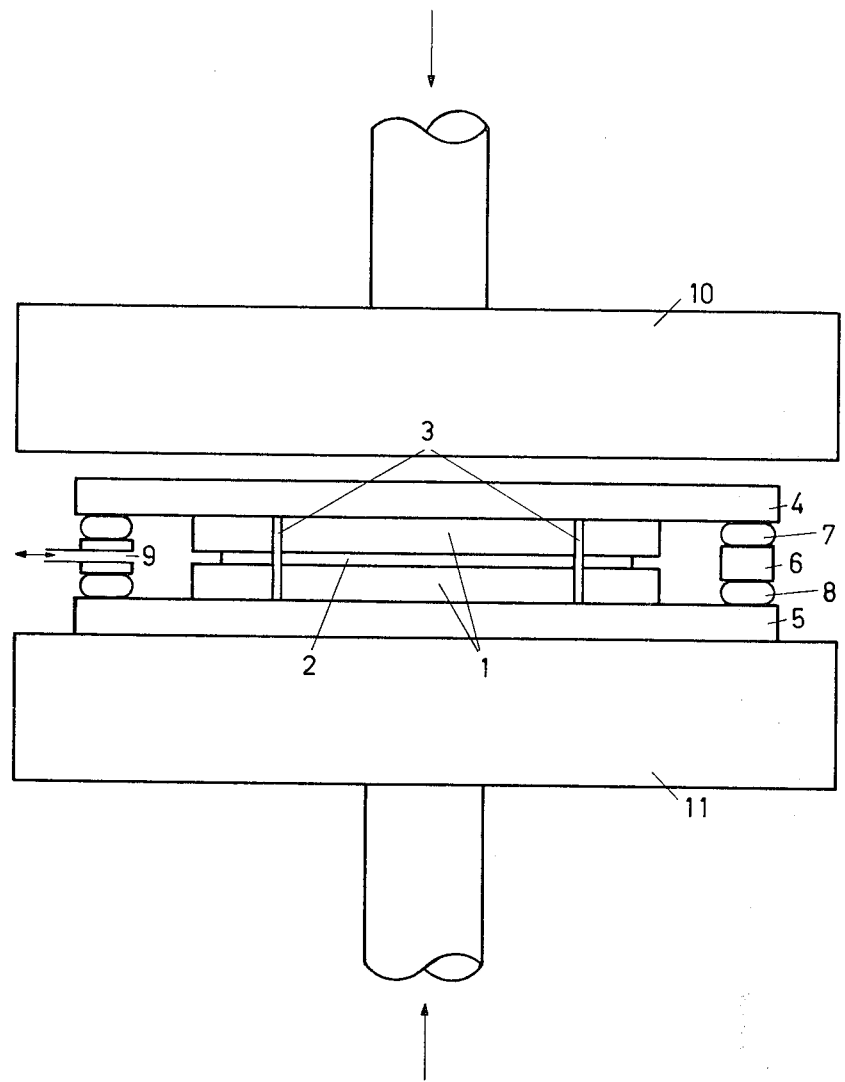

United States Patent [19]

La Roy et al.

[11] 3,960,635
[45] June 1, 1976

[54] METHOD FOR THE FABRICATION OF PRINTED CIRCUITS

[75] Inventors: Dick La Roy; Erik Adriaan Willem Van Ebbenhorst Tengbergen, both of Hengelo, Netherlands

[73] Assignee: N.V. Hollandse Signaalapparaten, Hengelo, Netherlands

[22] Filed: July 10, 1974

[21] Appl. No.: 486,976

Related U.S. Application Data

[63] Continuation of Ser. No. 259,005, June 2, 1972, abandoned.

[30] Foreign Application Priority Data
June 7, 1971 Netherlands...................... 7107750

[52] U.S. Cl.............................. 156/286; 156/311; 156/312
[51] Int. Cl.².......................................... C09J 5/06
[58] Field of Search ........... 156/285, 286, 288, 382, 156/295, 311, 312, 104; 174/68.5

[56] References Cited
UNITED STATES PATENTS

| | | |
|---|---|---|
| 3,305,416 | 2/1967 | Kahan et al......................... 156/286 |
| 3,573,126 | 3/1971 | Kougel............................... 156/286 |
| 3,660,199 | 3/1972 | Riccitiello et al.................. 156/311 |
| 3,679,515 | 7/1972 | Capellet............................. 156/311 |
| 3,681,167 | 8/1972 | Moore ............................... 156/311 |
| 3,681,171 | 8/1972 | Hojo et al. ......................... 156/382 |
| 3,852,136 | 12/1974 | Plumat et al....................... 156/286 |

*Primary Examiner*—Douglas J. Drummond
*Assistant Examiner*—Jerome W. Massie
*Attorney, Agent, or Firm*—Frank R. Trifari; David R. Treacy

[57] ABSTRACT

With a method for the fabrication of multilayers a laminate is obtained by the stacking of layers, which are formed by a carrier provided with a conductor pattern and interleaved by adhesive layers. The laminate is subjected to a process which is carried out in at least three phases: in the first phase moisture and air are extracted from the space in which the laminate is placed, in the second phase the laminate is pressed together under increasing temperature and in the third phase the pressing process is performed under another temperature rise to a certain maximum value and under a further increase in pressure, while air is admitted into the space where the laminate is situated.

2 Claims, 2 Drawing Figures

METHOD FOR THE FABRICATION OF PRINTED CIRCUITS

This is a continuation of application Ser. No. 259,005, filed June 2, 1972, now abandoned.

The invention relates to a method for the fabrication of printed circuits composed of multiple layers, and to a device for carrying out this method. Each of the layers, of which the printed circuit is to be composed, is formed by a carrier provided with a conductor pattern on at least one side. The layers are interleaved by adhesive and stacked on each other. The laminate, so obtained, is then pressed together under an increased temperature. During this pressing process the air in the space between the platens where the laminate is situated is evacuated.

A similar method is known from the German Auslegeschrift No. 1,942,843. In order to prevent air from being trapped in the laminate during the pressing process, which takes place at an increased temperature, this Auslegeschrift provides for the evacuation of the air from the space, in which the laminate is situated, at a time immediately preceding or almost simultaneously with the start of the pressing process until at least the time when the adhesive layers have melted and hardened. Using this method, however, the air enclosed in the laminate may not be fully withdrawn for the following reason: The printed circuit composed of multiple layers will usually contain one or more earthing layers. Such an earthing layer consists of a conductor layer on a carrier, which layer is etched away at the places where the interconnections between the track layers are applied afterwards. The earthing layer therefore contains many voids. When stacking the various layers, air will be trapped in the voids so that, after applying the pressure, the vacuum created around the laminate is not sufficient to remove all air from the laminate. Obviously, this risk is also present at the track layers, but is much smaller than at the earthing layers, since only the earthing layers usually contain a large number of voids as described above. Another disadvantage of to the method indicated in said Auslegeschrift lies in the time at which the air is admitted again into the space where the laminate is situated. In the method, as described in said Auslegeschrift, the adhesive should at least have melted and hardened to this effect; from the description in this Auslegeschrift it is seen that this has occurred within 3 to 5 minutes at a temperature of 160° to 170° C. However, components required for the hardening process are withdrawn from the adhesive at much lower temperatures by the created vacuum.

The object of the invention is to provide a better method for the fabrication of printed circuits composed of multiple layers, whereby the described difficulties are avoided. According to the invention the process for the fabrication of printed circuits composed of multiple layers is carried out in at least three phases, each having a defined time duration. In the first phase, moisture and air are extracted from the space in which the laminate is placed, in the second phase the laminate is pressed together under increasing temperature and in the third phase the presssing process takes place under another temperature rise to a certain maximum value and under a further increase in pressure, while at the same time air is admitted into the space where the laminate is situated.

Figure 2:
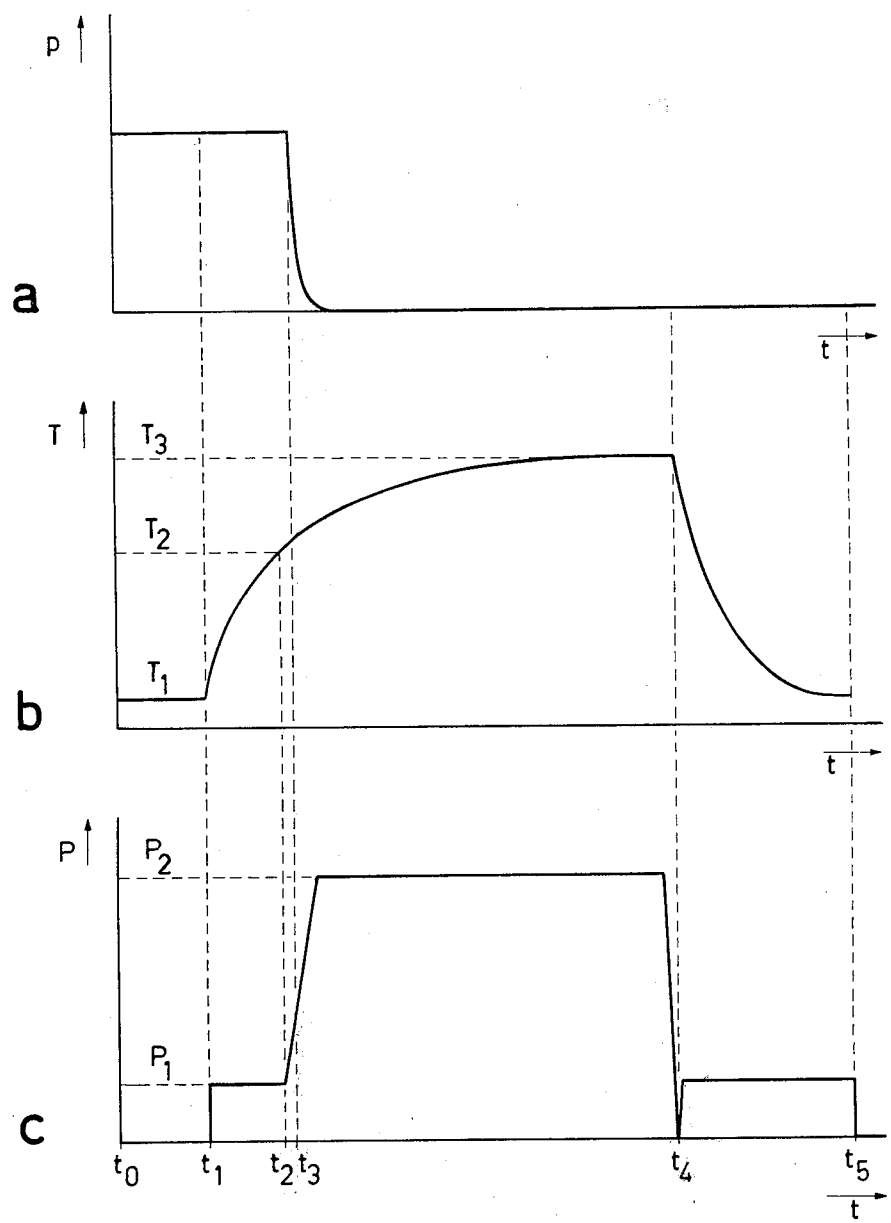

The invention and its advantages will further be explained with the aid of the figures, of which:

FIG. 1 illustrates schematically the device for carrying out the method according to the invention; and FIG. 2 shows three diagrams for further explanation of this method.

With the fabrication of printed circuits composed of multiple layers, hereafter called multilayers, a laminate is obtained through the stacking of carriers interleaved with adhesive layers, said carriers being provided with a track layer or earthing layer on one or both sides. The carriers provided with a conductor pattern, namely a track layer or earthing layer, consist of an epoxy-glass layer with a copper layer on one or both sides. The desired track pattern is etched from such a copper layer if it concerns a track layer. If the copper layer functions as earthing layer, it suffices to etch away the copper at the places where the interconnections between the various track layers must be applied. Consequently, a carrier provided with an earthing layer contains numerous voids. These voids lead, as already indicated, to the formation of air bubbles in the multilayer. The adhesive layers are formed by "prepreg"; this is a glass-fibre matting filled with resin and already partially polymerised (to the B stage). In addition to this prepolymerisation with the fabrication of the prepreg, further polymerisation occurs as its age increases. In the pressing process, hereafter described, due regard must in fact be paid to the extent to which the prepreg adhesive layers have already hardened.

Besides the above-mentioned track and earthing layers, the multilayer will contain one or several supply voltage layers; these are, however, practically identical to the earthing layers. When stacking the various layers, each track layer should preferably be enclosed by two earthing layers. However, in view of the requirements to be set with respect to characteristic impedance, thickness and cost price of the multilayer, the application of earthing layers will have to be limited to either side of two track layers. The track pattern of these two track layers should be such that any crosstalk is kept within the permissible limit. Furthermore, when stacking, a symmetrical construction should be adhered to as much as possible in order to prevent warping. It may also be necessary to use several prepreg layers together as adhesive layer.

The stacking of the various layers is done between two flat hard-steel plates, which are indicated in FIG. 1 by the numeral 1. In this figure the laminate is designated by 2. The laminate is provided with at least two reference holes 3. Pins are inserted through these holes to prevent the layers from shifting with respect to each other and with respect to the steel plates during the pressing process.

The laminate clamped between the steel plates is placed in a compressible drum. This drum is formed by a top and a bottom plate 4 and 5 respectively, a side wall 6 separate from the plates, and two sealing rings 7 and 8. The height of these rings with respect to that of the side wall 6 is such that the drum can be sufficiently compressed, that is, compressed to such an extent that a pressure can also be exerted on the laminate situated in the drum and clamped between the steel plates. The side wall 6 contains an opening 9, via which the air from the space where the laminate is situated can be evacuated with a vacuum pump. After the laminate clamped between the steel plates has been placed into the drum, the process for the fabrication of multilayers is performed in at least three phases according to the invention.

In the first phase, air and moisture is extracted from the drum and from the laminate situated in this drum. FIG. 2 shows three diagrams which indicate the various quantities characteristic to the process. The duration of the first phase is indicated by $t_1 - t_0$. FIG. 2a shows the low pressure p created in the drum; in this process this low pressure is approximately 0.15 mm mercury pressure. FIG. 2b illustrates the temperature of the drum. In the first phase, however, the drum is not yet in the press; therefore the temperature of the drum corresponds to the ambient temperature $T_1$. FIG. 2c illustrates the pressure exerted on the drum by the press; in the first phase this pressure is zero. Since in this phase no pressure can yet be exerted on the drum by the press, the chance that the air trapped in the laminate is not extracted is very small. The duration of the first phase is so selected that it may be assumed that all air is extracted from the laminate on the completion of this phase.

In the second phase the drum containing the laminate is placed in a preheated press, that is, between the platens 10 and 11 shown in FIG. 1. The platens are provided with a heating element, which keeps the temperature of the press constant at the value $T_3$ shown in FIG. 2b. In the process here described this temperature is approximately 180°C. While the low pressure in the drum is maintained, the press exerts a pressure $P_1$ for a time $t_2 - t_1$. This pressure is called the contact pressure and is approximately 3 kg/cm² in the process here described.

During the second phase a heat transfer from the press to the drum takes place; the temperature of the drum will gradually rise. The associated temperature gradient can be controlled by applying paper of a certain thickness (dependent on the desired temperature gradient) between the drum and the platens. In the second phase the resin of the prepreg adhesive layers will melt and fill up all voids between the layers. It will be clear that the pressure during this phase has a relatively low value, since otherwise the liquid resin between the various layers will be pressed out. The duration of the second phase is determined by the set temperature gradient, the prepolymerization of the adhesive layers, and the attained degree of viscosity of the adhesive layer. When the drum has reached the temperature $T_2$, this is about 120°C, the low pressure in the drum should be removed. If this were neglected, the components required for hardening of the adhesive would be extracted from this. The pressure is now increased to the value $P_2$, this is about 15 kg/cm²; owing to the increased rate of the hardening process under the increased temperature, the viscosity of the adhesive is already such that the adhesive will not be pressed out under this increased pressure.

The process is now in the third phase. The duration of this phase is indicated in FIG. 2 by $t_4 - t_3$ and is determined by the hardening process of the adhesive layers. In this phase the laminate assumes the temperature $T_3$ of the platens. Upon the completion of the third phase the fabrication process of the multilayer has ended in principle. The laminate is now a multilayer. However, the multilayer produced should still be cooled; this cooling process incurs the risk of warping. This risk is eliminated by symmetric cooling in a "cold" press. This is performed in a fourth phase, whose duration is indicated in FIG. 2 by $t_5 - t_4$. The multilayer assumes the ambient temperature during this phase; warping will be prevented through the exertion of a pressure $P_1$.

Since, on the one hand, a low pressure should be realised in the drum containing the laminate and no pressure is applied during the first phase, and, on the other hand, the drum is taken from a warm to a cold press, the use of such a drum, which can simply be inserted into or removed from the press is of great advantage. During the first and fourth phases the press can be utilized for a process being in the second or third phase.

What we claim is:

1. A method of fabricating printed circuits composed of multiple layers, each of said layers formed by a carrier provided with a conductor pattern on at least one side, said layers being interleaved by adhesive layers, comprising the steps of:

stacking said layers onto each other;
interleaving adhesive layers between said layers to form a laminate;
clamping the laminate together;
evacuating the air from the space where the laminate is situated;
maintaining evacuation of the air during a first period of time such that moisture and air are extracted from the laminate;
pressing the laminate together under a first pressure while maintaining said evacuation during a second period of time, and increasing the temperature of the laminate during said second period, a rate of increase of temperature and duration of the second period being such that the adhesive melts and fills any voids between the layers and that during said second period said temperature remains below a value at which components of the adhesive required for hardening will be extracted, during said second period said first pressure being below a value at which the adhesive layers are pressed out of the laminate;
then admitting air into the space where the laminate is situated; and
pressing the laminate under a further increase in pressure for a third period of time while increasing the temperature of the laminate to a predetermined maximum value such that said adhesive hardens.

2. A method of fabricating printed circuits composed of multiple layers as claimed in claim 1, further comprising the steps of subjecting said laminate to a pressure for a fourth period of time in an unheated press, the value of said pressure corresponding approximately with that of the pressure applied during said second period of time.

* * * * *